United States Patent
Chang et al.

(10) Patent No.: US 8,614,012 B2
(45) Date of Patent: Dec. 24, 2013

(54) COATED ARTICLE AND METHOD FOR MAKING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Cong Li, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 124 days.

(21) Appl. No.: 13/166,311

(22) Filed: Jun. 22, 2011

(65) Prior Publication Data

US 2012/0171473 A1 Jul. 5, 2012

(30) Foreign Application Priority Data

Dec. 31, 2010 (CN) .......................... 2010 1 0618079

(51) Int. Cl.
*B32B 9/00* (2006.01)

(52) U.S. Cl.
USPC ............ 428/698; 427/577; 428/336; 428/408

(58) Field of Classification Search
USPC .......................... 428/336, 408, 698; 427/577
See application file for complete search history.

(56) References Cited

U.S. PATENT DOCUMENTS

| | | | | |
|---|---|---|---|---|
| 5,227,211 A * | 7/1993 | Eltoukhy et al. | ............... | 428/408 |
| 5,527,596 A * | 6/1996 | Kimock et al. | ............... | 428/336 |
| 6,303,225 B1 * | 10/2001 | Veerasamy | ................... | 428/408 |
| 6,713,179 B2 * | 3/2004 | Veerasamy | ................... | 428/408 |
| 6,935,618 B2 * | 8/2005 | Welty et al. | ................... | 428/698 |
| 7,563,509 B2 * | 7/2009 | Chen | ............................ | 428/408 |

OTHER PUBLICATIONS

Yang et al "Wettability and biocompatability of nitrogen-doped hydrogenated amorphous carbon films: Effect of nitrogen" Nuclear Ins. & Methods in Phys. Res. B 242 (2006) p. 22-25.*

Tessier et al "Carbon nitride thin films as protective coatings fro biomaterials: sysnthesis, mechanical and biocompatibility characterizations" Diamond & Realated Materials 12 (2003) p. 1066-1069.*

* cited by examiner

*Primary Examiner* — Archene Turner
(74) *Attorney, Agent, or Firm* — Altis Law Group, Inc.

(57) ABSTRACT

A coated article is provided. The coated article includes a substrate, a hydrophobic layer formed on the substrate. The hydrophobic layer is an amorphous carbon nitride layer which is defined as $CN_y$, wherein y is in a range of from about 1 to about 3. The water contact angle of the hydrophobic layer 13 is about 100° to about 110°. The hydrophobic layer has a good chemical stability, high-temperature resistance and a good abrasion resistance, which effectively extends the use time of the coated article. A method for making the coated article is also described therein.

7 Claims, 2 Drawing Sheets

COATED ARTICLE AND METHOD FOR MAKING SAME

CROSS-REFERENCE TO RELATED APPLICATIONS

The present application is related to co-pending U.S. patent application Ser. No. 13/166,318, entitled "COATED ARTICLE AND METHOD FOR MAKING SAME", by Zhang et al. These applications have the same assignee as the present application and have been concurrently filed herewith. The above-identified applications are incorporated herein by reference.

BACKGROUND

1. Technical Field

The present disclosure relates to coated articles, particularly to coated articles with hydrophobic property and a method for making the coated articles.

2. Description of Related Art

Good wetting property is important to solid surfaces. The solid surface, if being hydrophobic, requires that the water contact angle of the solid surface to be greater than 90°. To obtain a hydrophobic surface, the solid surface is usually coated with an organic hydrophobic layer. The organic hydrophobic layer is generally made of polymer material including fluorine and/or silicon. However, organic hydrophobic materials have shortcomings, such as low hardness, poor wear resistance and low heat-resistance temperature, which limits further applications of the organic hydrophobic materials.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
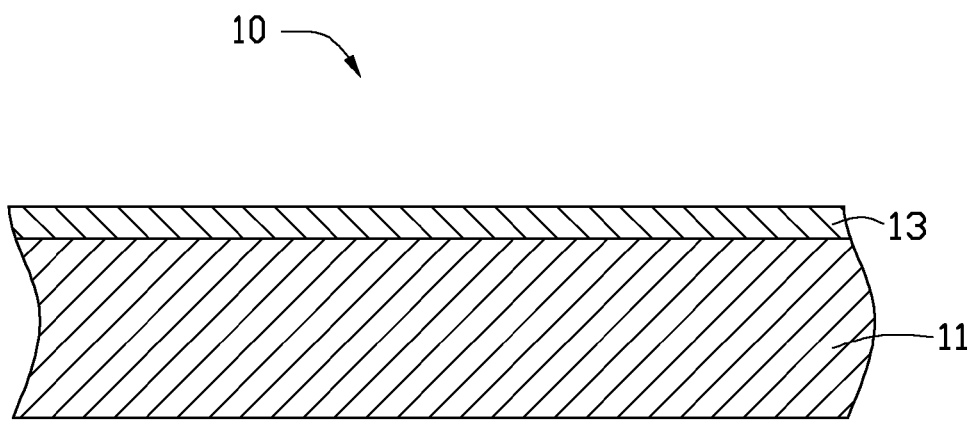
FIG. 1 is a cross-sectional view of an exemplary coated article.

FIG. 1 shows a coated article 10 according to an exemplary embodiment. The coated article 10 includes a substrate 11 and a hydrophobic layer 13 formed on the substrate 11.

The substrate 11 is made of stainless steel or glass.

The hydrophobic layer 13 is an amorphous carbon nitride layer which may be defined as $CN_y$ layer, wherein $1 \leq y \leq 3$. An environmentally friendly vacuum sputtering process may form the hydrophobic layer 13. The hydrophobic layer 13 has a thickness of about 200 nm to about 350 nm. The hydrophobic layer 13 has a low surface energy and the water contact angle of the hydrophobic layer 13 is about 100° to about 110°.

A method for making the coated article 10 may include the following steps:

The substrate 11 is pretreated. The pre-treating process may include the following steps:

The substrate 11 is ultrasonically cleaned with alcohol solution in an ultrasonic cleaner (not shown), to remove impurities such as grease or dirt from the substrate 11. Then, the substrate 11 is dried.

Figure 2:
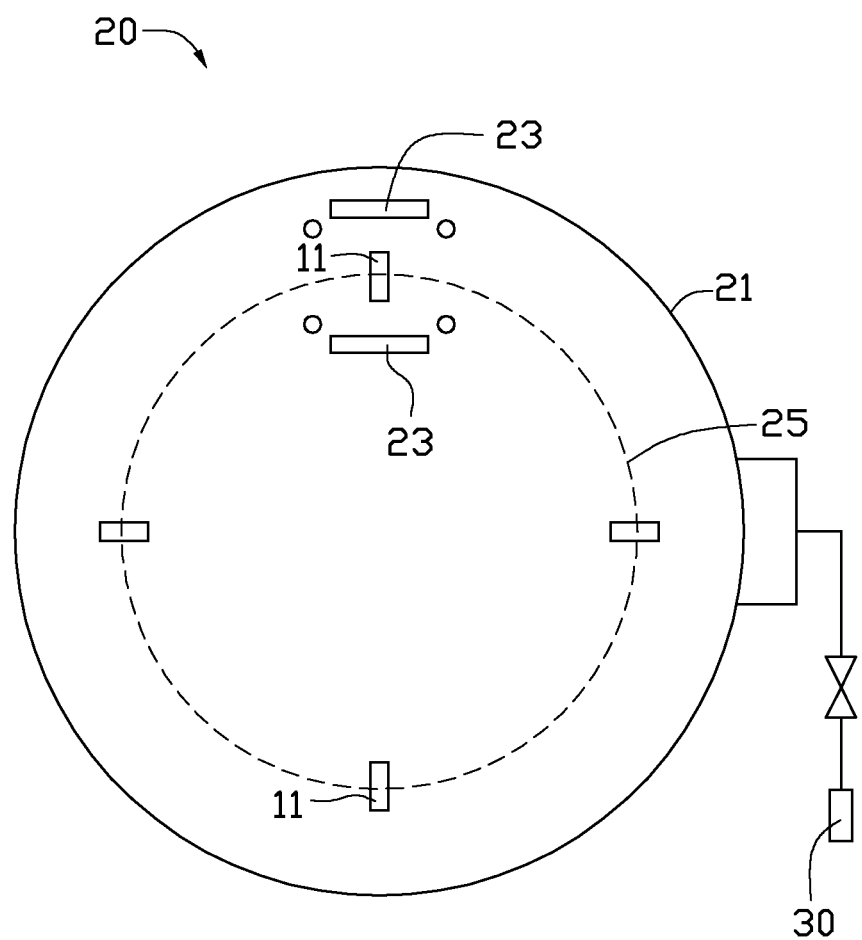
FIG. 2 is a schematic view of a vacuum sputtering device for processing the coated article in FIG. 1.

FIG. 2 shows a vacuum sputtering device 20, which includes a vacuum chamber 21 and a vacuum pump 30 connected to the vacuum chamber 21. The vacuum pump 30 is used for evacuating the vacuum chamber 21. The vacuum chamber 21 has a pair of graphite targets 23 and a rotary rack (not shown) positioned therein. The rotary rack drives the substrate 11 to revolve along a circular path 25, the substrate 11 also revolves on its own axis while revolving along the circular path 25.

The substrate 11 is plasma cleaned. The substrate 11 is positioned in the rotary rack of the vacuum chamber 21. The vacuum chamber 21 is then evacuated to $3.0 \times 10^{-5}$ Torr. Argon gas (abbreviated as Ar, having a purity of about 99.999%) is used as sputtering gas and is fed into the vacuum chamber 21 at a flow rate of about 500 standard-state cubic centimeters per minute (sccm). A negative bias voltage in a range of from about −100 volts (V) to about −180 V is applied to the substrate 11, then high-frequency voltage is produced in the vacuum chamber 21 and the Ar is ionized to plasma. The plasma then strikes the surface of the substrate 11 to clean the surface of the substrate 11. The plasma cleaning of the substrate 11 takes from about 3 minutes (min) to about 10 min. The plasma cleaning process will enhance the bond between the substrate 11 and the hydrophobic layer 13.

The hydrophobic layer 13 is vacuum sputtered on the pretreated substrate 11. Vacuum sputtering of the hydrophobic layer 13 is implemented in the vacuum chamber 21. The vacuum chamber 21 is evacuated to $8.0 \times 10^{-3}$ Pa and heated to about 180° C. to about 250° C. Ar is used as sputtering gas and is fed into the vacuum chamber 21 at a flow rate of about 300 sccm to about 500 sccm. Ammonia gas ($NH_3$) is used as reaction gas and is fed into the vacuum chamber 21 at a flow rate of about 200 sccm to about 320 sccm. The graphite targets 23 are then powered on and set to about 5 kw to about 10 kw. A negative bias voltage is applied to the substrate 11 and the negative bias voltage is from about −120 V to about −200 V. Depositing of the hydrophobic layer 13 takes about 38 min to about 55 min.

EXAMPLES

Experimental examples of the present disclosure are described as followings.

Example 1

The vacuum sputtering device 20 used in example 1 was a medium frequency magnetron sputtering device (model No. SM-1100H) manufactured by South Innovative Vacuum Technology Co., Ltd., located in Shenzhen, China.

The substrate 11 was made of glass.

Plasma cleaning: Ar was fed into the vacuum chamber 21 at a flow rate of about 500 sccm. A negative bias voltage of about −100 V was applied to the substrate 11. The plasma cleaning of the substrate 11 took about 5 min.

Sputtering to form the hydrophobic layer 13: The vacuum chamber 21 was heated to about 200° C. Ar was fed into the vacuum chamber 21 at a flow rate of about 350 sccm. Ammonia gas was fed into the vacuum chamber 21 at a flow rate of about 200 sccm. The power of the graphite targets 23 was 8 kw and a negative bias voltage of −120 V was applied to the substrate 11. The depositing of the hydrophobic layer 13 took 40 min. The hydrophobic layer 13 had a thickness of about 200 nm.

Example 2

The vacuum sputtering device 20 used in example 2 was the same in example 1.

The substrate 11 was made of stainless steel.

Plasma cleaning: Ar was fed into the vacuum chamber 21 at a flow rate of about 500 sccm. A negative bias voltage of about −150 V was applied to the substrate 11. Plasma cleaning of the substrate 11 took about 5 min.

Sputtering to form the hydrophobic layer 13: The vacuum chamber 21 was heated to about 200° C. Ar was fed into the vacuum chamber 21 at a flow rate of about 250 sccm. Ammonia gas was fed into the vacuum chamber 21 at a flow rate of about 245 sccm. The power of the graphite targets 23 was 10 kw and a negative bias voltage of about −200 V was applied to the substrate 11. The depositing of the hydrophobic layer 13 took 50 min. The hydrophobic layer 13 had a thickness of about 300 nm.

Results of the Above Examples

The water contact angles of the coated articles 10 made in example 1 and 2 were measured using a contact angle measuring instrument. The water contact angle of the hydrophobic layer 13 in example 1 and 2 is about 102.7° and 108°, respectively.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a hydrophobic layer formed on the substrate, the hydrophobic layer being an amorphous carbon nitride layer which is defined as $CN_y$ layer, wherein $1 \leq y \leq 3$.

2. The coated article as claimed in claim 1, wherein the substrate is made of stainless steel or glass.

3. The coated article as claimed in claim 1, wherein the hydrophobic layer has a thickness of about 200 nm to about 350 nm.

4. A method for making a coated article, comprising:
   providing a substrate; and
   forming a hydrophobic layer on the substrate by magnetron sputtering process using ammonia gas as reaction gas and graphite targets, the hydrophobic layer is an amorphous carbon nitride layer which is defined as $CN_y$ layer, wherein $1 \leq y \leq 3$.

5. The method as claimed in claim 4, wherein forming the hydrophobic layer uses argon gas as sputtering gas, the argon has a flow rate of about 300 sccm to about 500 sccm; ammonia gas has a flow rate of about 200 sccm to about 320 sccm; magnetron sputtering the hydrophobic layer is at a temperature of about 180° C. to about 250° C., the power of the graphite targets is about 5 kw to about 10 kw, a negative bias voltage of about −120 V to about −200 V is applied to the substrate, vacuum sputtering of the hydrophobic layer takes about 38 min to about 55 min.

6. The method as claimed in claim 4, wherein the substrate is made of stainless steel or glass.

7. The method as claimed in claim 4, wherein the hydrophobic layer has a thickness of about 200 nm to about 350 nm.

* * * * *